United States Patent
Li et al.

(10) Patent No.: US 9,337,860 B1
(45) Date of Patent: May 10, 2016

(54) PRECISION SUB-RADIX2 DAC WITH ANALOG WEIGHT BASED CALIBRATION

(71) Applicant: Maxim Integrated Products, Inc., San Jose, CA (US)

(72) Inventors: Yuanfang Li, Irvine, CA (US); David Castaneda, Morgan Hill, CA (US); Jean CauXuan Le, Santa Clara, CA (US); Patrick Chan, Cupertino, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/721,481

(22) Filed: May 26, 2015

Related U.S. Application Data

(60) Provisional application No. 62/020,676, filed on Jul. 3, 2014.

(51) Int. Cl.
  *H03M 1/66* (2006.01)
  *H03M 1/74* (2006.01)

(52) U.S. Cl.
  CPC ..................................... *H03M 1/745* (2013.01)

(58) Field of Classification Search
  CPC ... H03M 1/0692; H03M 1/46; H03M 1/1061; H03M 1/745; H03M 1/687; H03M 2201/4266; H03M 2201/4262; H03M 2201/52; H03M 1/403; H03M 1/442; H03M 2201/2291
  USPC .................. 341/118–121, 144–154, 155, 172
  See application file for complete search history.

(56) References Cited

U.S. PATENT DOCUMENTS

| | | | |
|---|---|---|---|
| 4,336,526 A | 6/1982 | Weir | |
| 4,396,907 A | 8/1983 | Wintzer et al. | |
| 4,843,394 A | 6/1989 | Linz et al. | |
| 4,970,514 A | 11/1990 | Draxelmayr | |
| 5,644,308 A * | 7/1997 | Kerth ................... | H03M 1/0692 341/120 |
| 5,977,898 A | 11/1999 | Ling et al. | |
| 6,154,121 A * | 11/2000 | Cairns .................... | H03M 1/664 341/118 |
| 6,380,877 B2 | 4/2002 | Castaneda et al. | |
| 6,417,794 B1 * | 7/2002 | Munoz ................ | H03M 1/1061 341/118 |
| 6,486,806 B1 * | 11/2002 | Munoz ................ | H03M 1/1038 341/118 |
| 6,781,536 B1 | 8/2004 | Martins | |
| 7,242,338 B2 | 7/2007 | Jiang et al. | |
| 7,535,389 B1 | 5/2009 | Teterwak | |
| 7,812,665 B2 * | 10/2010 | Eschauzier ......... | H03F 3/45753 327/124 |
| 8,330,634 B2 | 12/2012 | Li et al. | |
| 8,416,115 B2 * | 4/2013 | Araki .................... | H03M 1/466 341/172 |
| 8,525,720 B2 * | 9/2013 | Shah .................... | H03M 1/0692 341/155 |
| 8,717,214 B1 | 5/2014 | Li et al. | |
| 2007/0132626 A1 * | 6/2007 | Hurrell ............... | H03M 1/1047 341/155 |
| 2013/0033392 A1 * | 2/2013 | Nani ...................... | H03M 1/08 341/166 |

OTHER PUBLICATIONS

Ziya G. Boyacigiller, Basil Weir and Peter D. Bradshaw, Session VI: Acquisition Circuits; "An Error-Correcting 14b/20.mu.s CMOS A/D Converter", Feb. 18, 1981, IEEE International Solid-State Circuits Conference; pp. 62-63.

* cited by examiner

*Primary Examiner* — Linh Nguyen

(57) ABSTRACT

A system includes a sub-binary radix digital-to-analog converter (DAC) that converts a digital input signal to an analog output signal based on a sub-radix DAC code. A radix conversion module performs radix conversion on the digital input signal. To perform the radix conversion, the radix conversion module associates bit positions corresponding to the digital input signal with respective analog weights and converts the digital input signal to the sub-radix DAC code based on the respective analog weights.

18 Claims, 14 Drawing Sheets for i=0 to NL-1

$WL_i = VOUT(code=2^i)/VLSB$

Where $VLSB = VREF/2^M$ for seg=0 to $2^{NS}-2$ $WS_{seg} = VOUT(code=2^{NL}*(seg+1))/VLSB$ error=d
for seg=$2^{NS}-2$ down to 0
    if error>=$WS_{seg}$
        error=error-$WS_{seg}$
        Set MSB bits to be (seg+1)
        break
    end if
end for
for i=NL-1 down to 0
    if error>=$WL_i$ then
        error=error-$WL_i$
        bit i is set to 1
    else
        bit i is cleared to 0
    end if
end for

| Code | QN |
|------|-----|
| 0 | 0 |
| 1 | 1 |
| 2 | 1.5 |
| 3 | 2.5 |
| 4 | 2.25 |
| 5 | 3.25 |
| 6 | 3.75 |
| 7 | 4.75 |
| 8 | 3.375 |
| 9 | 4.375 |
| 10 | 4.875 |
| 11 | 5.875 |
| 12 | 5.625 |
| 13 | 6.625 |
| 14 | 7.125 |
| 15 | 8.125 |

| Name | Analog Weight |
|------|---------------|
| WL0 | 0.8615 |
| WL1 | 1.2923 |
| WL2 | 1.9385 |
| WL3 | 2.9077 |

| Input DAC Code | Radix DAC code | OUT |
|---|---|---|
| 000 | 0000 | 0 |
| 001 | 0001 | 1 |
| 010 | 0100 | 2.25 |
| 011 | 1000 | 3.375 |
| 100 | 1001 | 4.375 |
| 101 | 1100 | 5.625 |
| 110 | 1101 | 6.625 |
| 111 | 1110 | 7.125 |

632

PRECISION SUB-RADIX2 DAC WITH ANALOG WEIGHT BASED CALIBRATION

CROSS-REFERENCE TO RELATED APPLICATIONS

This application claims the benefit of U.S. Provisional Application No. 62/020,676, filed on Jul. 3, 2014. The entire disclosure of the application referenced above is incorporated herein by reference.

FIELD

The present disclosure relates to a sub-binary radix digital-to-analog converter (DAC).

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Digital-to-analog converters (DACs) receive a digital input signal and convert the digital input signal into an analog output signal. The digital input signal has a range of digital codes that are converted into a continuous range of analog signal levels of the analog output signal. Accordingly, DACs are typically used to convert data between applications operating in digital and analog domains. For example only, applications of DACs include, but are not limited to, video display drivers, audio systems, digital signal processing, function generators, digital attenuators, data storage and transmission, precision instruments, and data acquisition systems.

A variety of types of DACs are available based upon desired functionality. For example only, DACs may have varying predetermined resolutions of the digital input signal, receive different encoded digital input signals, have different ranges of analog output signals using a fixed reference or a multiplied reference, and provide different types of analog output signals. Various DAC performance factors include, but are not limited to, settling time, full scale transition time, accuracy or linearity, and resolution.

A number of bits (i.e. a bit width) of the digital input signal defines the resolution, a number of output (quantization) levels, and a total number of digital codes that are acceptable for the DAC. For example, if the digital input signal is m-bits wide, the DAC has $2^m$ output levels.

In sub-binary radix (i.e. sub-radix$_2$) DACs, the ratio of a weighted DAC element to a next (lower) weighted DAC element is a constant less than 2 (i.e. sub-binary). For example only, the ratio may be approximately 1.85.

Referring now to FIG. 1, an example sub-binary radix DAC 10 includes a ladder module 12 having m ladder bits and a switch control module 14. For example only, the ladder module 12 is an R-6R ladder. The ladder module 12 receives analog reference signals 16 and 18. For example only, the analog reference signal 16 may be ground and the analog reference signal 18 may be a positive reference voltage. The switch control module 14 receives bits $b_0, b_1, \ldots, b_{m-1}$ of an m-bit binary digital input signal 20 and controls switches (not shown) of the ladder module 12 based on the m bits of the digital input signal 20. The ladder module 12 generates an analog output signal 22 based on the digital input signal 20 (i.e. the controlled switches of the ladder module 12) and the analog reference signals 16 and 18. Accordingly, the analog output signal 22 corresponds to the digital-to-analog conversion of the digital input signal 20.

Referring now to FIG. 2, the ladder module 12 of the DAC 10 is shown to include resistors $RL_0 \ldots RL_{m-1}$, referred to collectively as $RL_i$, and resistors $RDL_0 \ldots RDL_{m-1}$, referred to collectively as resistors $RDL_i$. Each of the resistors $RL_i$ has a value R and each of the resistors $RDL_i$ has a value $\beta R$. In other words, $\beta$ corresponds to a ratio of an RDL resistor value to an RL resistor value. A termination resistor RT has a value of $\gamma R$. The values of $\beta$ and $\gamma$ satisfy the equation $\gamma 2 = \beta + \gamma$. The radix of the DAC 10 corresponds to $$\frac{\gamma}{\gamma-1}.$$

The analog reference signals 16 and 18 are selectively provided to the resistors RT and $RDL_i$ via switches 30.

The sub-binary radix DAC 10 is not monotonic. In other words, a transfer function of the DAC 10 is non-monotonic and a conversion between the non-monotonic transfer function and a monotonic transfer function is needed. Further, due to code overlapping, a dynamic range of the DAC 10 is reduced. Consequently, the DAC 10 uses additional bits to recover the dynamic range, and an algorithm is used to convert the bits of the m-bit binary digital input signal 20 to a sub-radix DAC code having additional bits. Conversion between the non-monotonic transfer function and the monotonic transfer function is performed via a calibration step and a radix conversion step.

The calibration step may be performed using an example recursive successive approximation method. The method determines a last code having a smaller value than an analog bit weight of a current bit for each of the bits of the digital input signal 20 (from the LSB to the MSB). Results of the method are used to generate a calibration table that associates each bit i from 0 to m−1 with a corresponding digital weight $WL_i$. An example calibration table 50 for m=4 is shown in FIG. 3. The example calibration table 50 corresponds to the following design parameters: effective number of bits (i.e. bits of input DAC code)=3; radix DAC number of bits=4; and radix=1.5.

The radix conversion step is performed using an example successive subtraction method. The method performs successive subtraction of the digital weight $WL_i$ from the binary input value of the digital input signal 20 to determine which bits of the DAC 10 are set and which bits of the DAC 10 are cleared. Results of the method are used to generate a radix DAC code, and subsequently an output value, for each input DAC code. For example only, a code mapping table 70 as shown in FIG. 4 illustrates a relationship between input DAC codes from 000 to 111 and corresponding radix DAC codes and output values. The example code mapping table 70 corresponds to the following design parameters: effective number of bits=3; radix DAC number of bits=4; and radix=1.5.

SUMMARY

A system includes a sub-binary radix digital-to-analog converter (DAC) that converts a digital input signal to an analog output signal based on a sub-radix DAC code. A radix conversion module performs radix conversion on the digital input signal. To perform the radix conversion, the radix conversion module associates bit positions corresponding to the digital input signal with respective analog weights and converts the digital input signal to the sub-radix DAC code based on the respective analog weights.

A method of operating a sub-binary radix digital to analog converter (DAC) includes converting a digital input signal to an analog output signal based on a sub-radix DAC code and performing radix conversion on the digital input signal. Performing the radix conversion includes associating bit positions corresponding to the digital input signal with respective analog weights and converting the digital input signal to the sub-radix DAC code based on the respective analog weights.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figures 1, 3, 4:
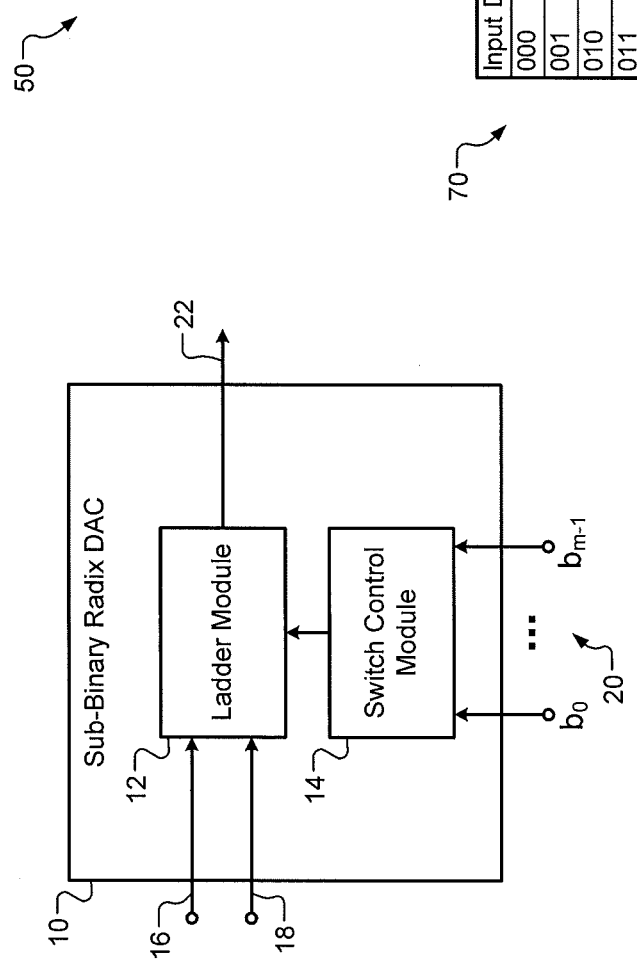
FIG. 1 is a functional block diagram of a sub-binary radix DAC according to the prior art.
FIG. 3 is a calibration table for a sub-binary radix DAC according to the prior art.
FIG. 4 is a code mapping table of a sub-binary radix DAC according to the prior art.
Figure 2:
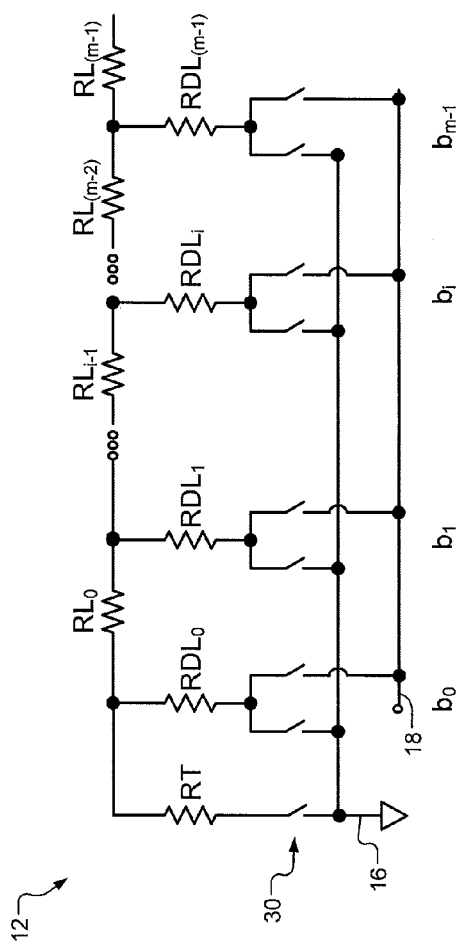
FIG. 2 is a schematic of a ladder module of a sub-binary radix DAC according to the prior art.
Figure 5:
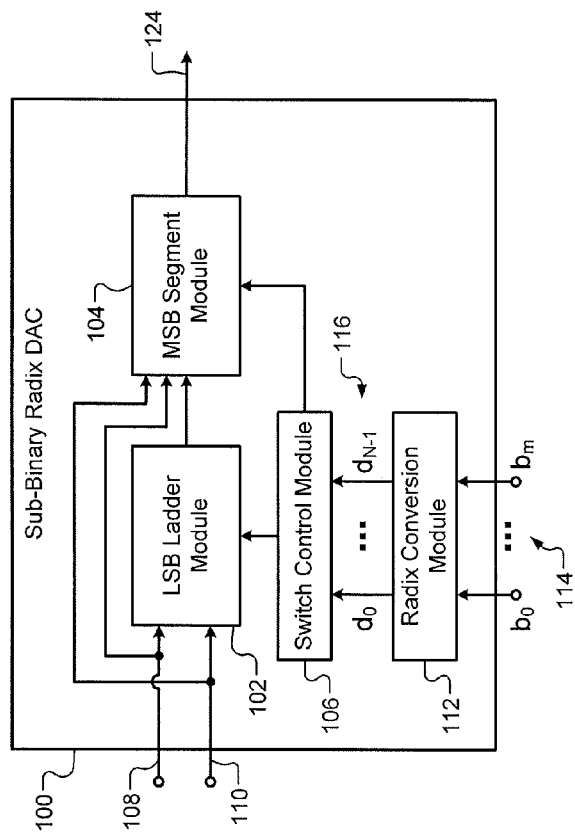
FIG. 5 is a functional block diagram of a sub-binary radix DAC according to the present disclosure.

Referring now to FIG. 5, a sub-binary radix DAC 100 according to the present disclosure includes an LSB ladder module 102, an MSB segment module 104, and a switch control module 106. For example only, the LSB ladder module 102 is an R-$\beta$R ladder. The LSB ladder module 102 and the MSB segment module 104 receive analog reference signals 108 and 110. For example only, the analog reference signal 108 may be ground and the analog reference signal 110 may be a positive reference voltage.

A radix conversion module 112 receives a binary digital input signal 114 and outputs an N bit switch control signal 116, where N (a number of radix DAC bits) corresponds to NL (a number of ladder bits)+NS (a number of segment bits). In other words, N=NL+NS. For example only, for an 18 bit DAC (i.e. for an 18 bit digital input signal), N is greater than 18. The value of NS (and therefore N) may be selected based on desired linearity or other performance parameters. N, NL, and NS may be integers.

The switch control module 106 receives the N bits of the switch control signal 116 and controls switches (not shown) of the LSB ladder module 102 and the MSB segment module 104 based on the switch control signal 116. For example only, MSB segments of the MSB segment module 104 may be thermometer encoded. The MSB segment module 104 provides NS segment bits and generates an analog output signal 124 based on the controlled switches of the LSB ladder module 102 and the MSB segment module 104 and the analog reference signals 108 and 110. Accordingly, the analog output signal 124 corresponds to the digital-to-analog conversion of the digital input signal 114 after the radix conversion module 112 converts the digital input signal 114 to the N bit switch control signal 116.

Figures 6, 7, 8:
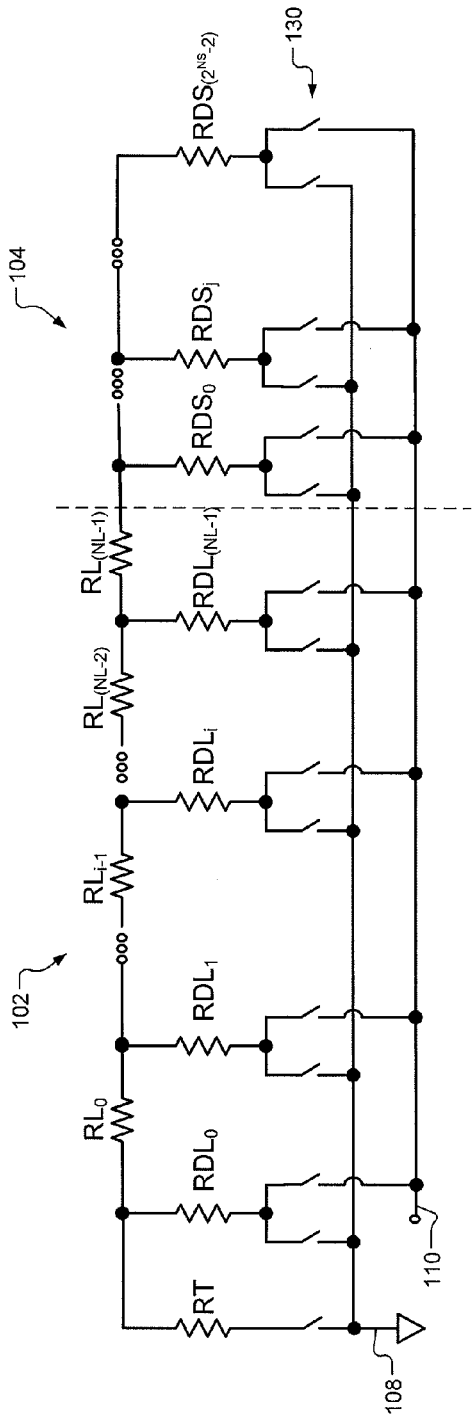
FIG. 6 is a schematic of a combination of a ladder module and an MSB segment module of a sub-binary radix DAC according to the present disclosure.
FIG. 7 illustrates a ladder calibration method according to the present disclosure.
FIG. 8 illustrates a segment calibration method according to the present disclosure.

Referring now to FIG. 6, the LSB ladder module 102 of the DAC 100 is shown to include resistors RL0 ... RLNL-1, referred to collectively as RLi, resistors RDL0 ... RDLNL-1, referred to collectively as resistors RDLi, and termination resistor RT. Each of the resistors RLi has a value R and each of the resistors RDLi has a $\beta R$. The termination resistor RT has a value of $\gamma R$. The values of $\beta$ and $\gamma$ satisfy the equation $\gamma 2=\beta+\gamma$. The MSB segment module 104 is shown to include resistors RDS0 ... RDS($2^{Ns}$−2), referred to collectively as resistors RDSj. Each of the resistors RDSj has a value $\beta R$. The analog reference signals 108 and 110 are selectively provided to the resistors RT, RDLi, and RDSj via switches 130. The modified structure of the DAC 100 including the bits provided by the MSB segment module 104 improves resistance and drift sensitivities of the switch and metal connections of the DAC 100. Further, the MSB segment module 104 improves output noise of the DAC 100 without lowering DAC unit resistance.

Bits of the ladder module 102 and the segment module 104 are set or cleared using the switches 130. For example, a bit may be set when a corresponding one of the switches 130 connected to the analog reference signal 110 is closed. Conversely, a bit may be cleared when a corresponding one of the switches 130 connected to ground is closed.

Although the DAC 100 as described above implements a fixed radix for each bit, any of the techniques described herein may be applied to a mixed radix. For example only, a first number of bits associated with the LSB ladder module 102 may have a first radix (e.g. 2). Accordingly, a first number of stages of the LSB ladder module 102 associated with the first number of bits may operate as an R-2R DAC. For example only, the first number of bits may correspond to a number of stages that ensures monotonic output without any calibration. A remaining number of bits associated with the LSB ladder module 102 may have a different radix. The number of bits having the different radix may be determined based on, for example only, resistor matching and desired monotonic output.

An algorithm according to the present disclosure performs conversion between a non-monotonic transfer function of the DAC 100 and a monotonic transfer function via a calibration step and a radix conversion step. The calibration step includes an LSB ladder calibration step and an MSB segment calibration step. The radix conversion step converts the incoming digital code to a sub-radix DAC setting.

Referring now to FIG. 7, the LSB ladder calibration step is performed using, for example only, a method 150. The method 150 measures the ladder bit weights and converts the ladder bit weights to LSB as the analog weights WL (for i from 0 to NL−1).

Referring now to FIG. 8, the MSB segment calibration step is performed using a segment calibration method 160. The method 160 measures the segment weights and converts the segment weights to LSB as the analog weights WS (for seg from 0 to $2^{NS}$−2).

Figures 9, 10:
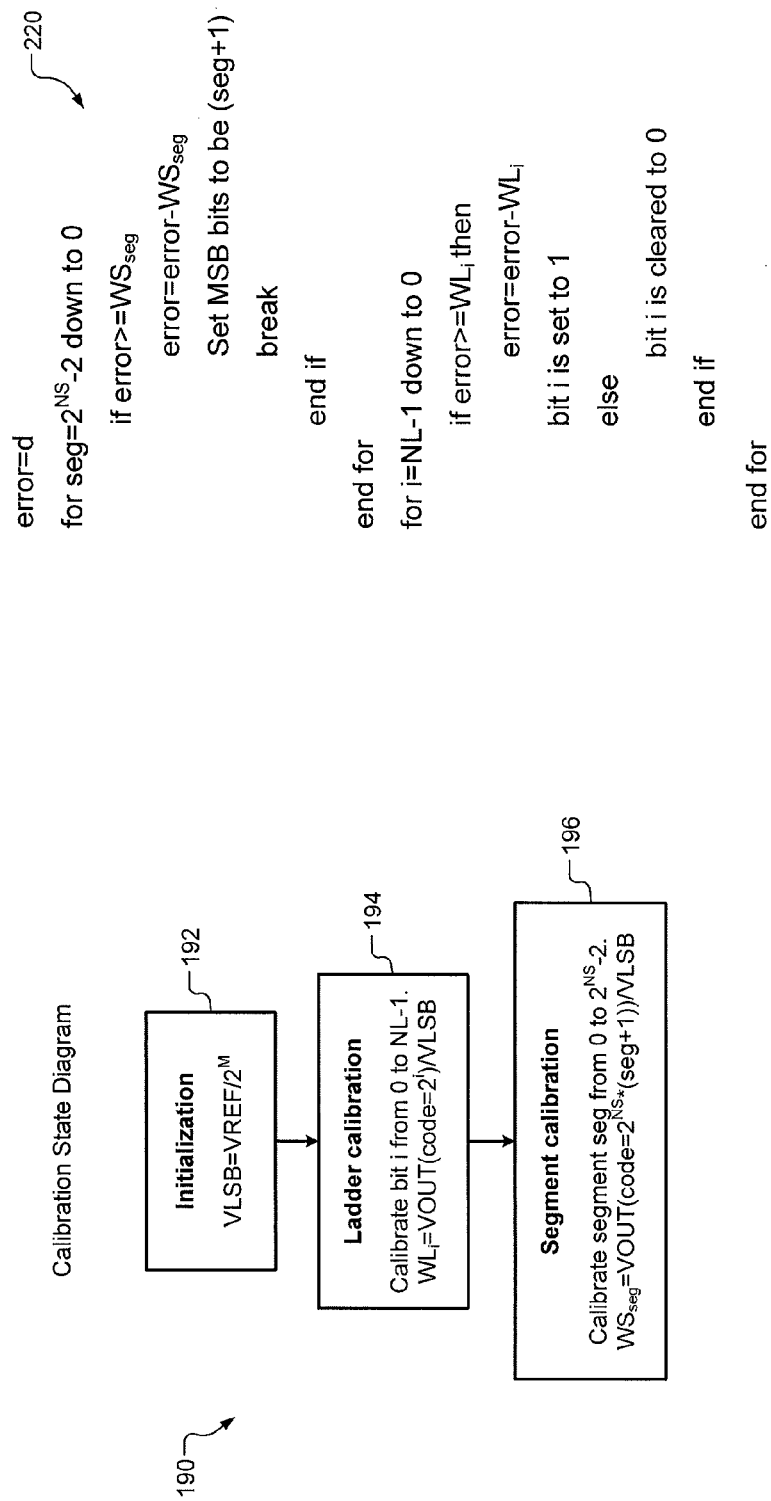
FIG. 9 is a flow diagram illustrating steps of the ladder calibration method and the segment calibration method according to the present disclosure.
FIG. 10 illustrates a radix conversion method for performing a radix conversion step according to the present disclosure.

Referring now to FIG. 9, the methods 150 and 160 are shown as a flow diagram 190 that begins in step 192. At 192, VLSB is initialized as VREF/$2^M$, where M corresponds to the DAC effective number of bits. At 194, ladder calibration is performed for each bit i (for i from 0 to NL−1, where NL corresponds to the number of ladder bits). At 196, segment calibration is performed for each segment seg (for seg from 0 to $2^{Ns}$−2).

Referring now to FIG. 10, the radix conversion step is performed using a radix conversion method 220. The radix conversion method 220 determines which bits of the DAC 100 are kept (i.e. set to 1) and which bits are cleared or ignored (i.e. set to 0).

Figure 11:
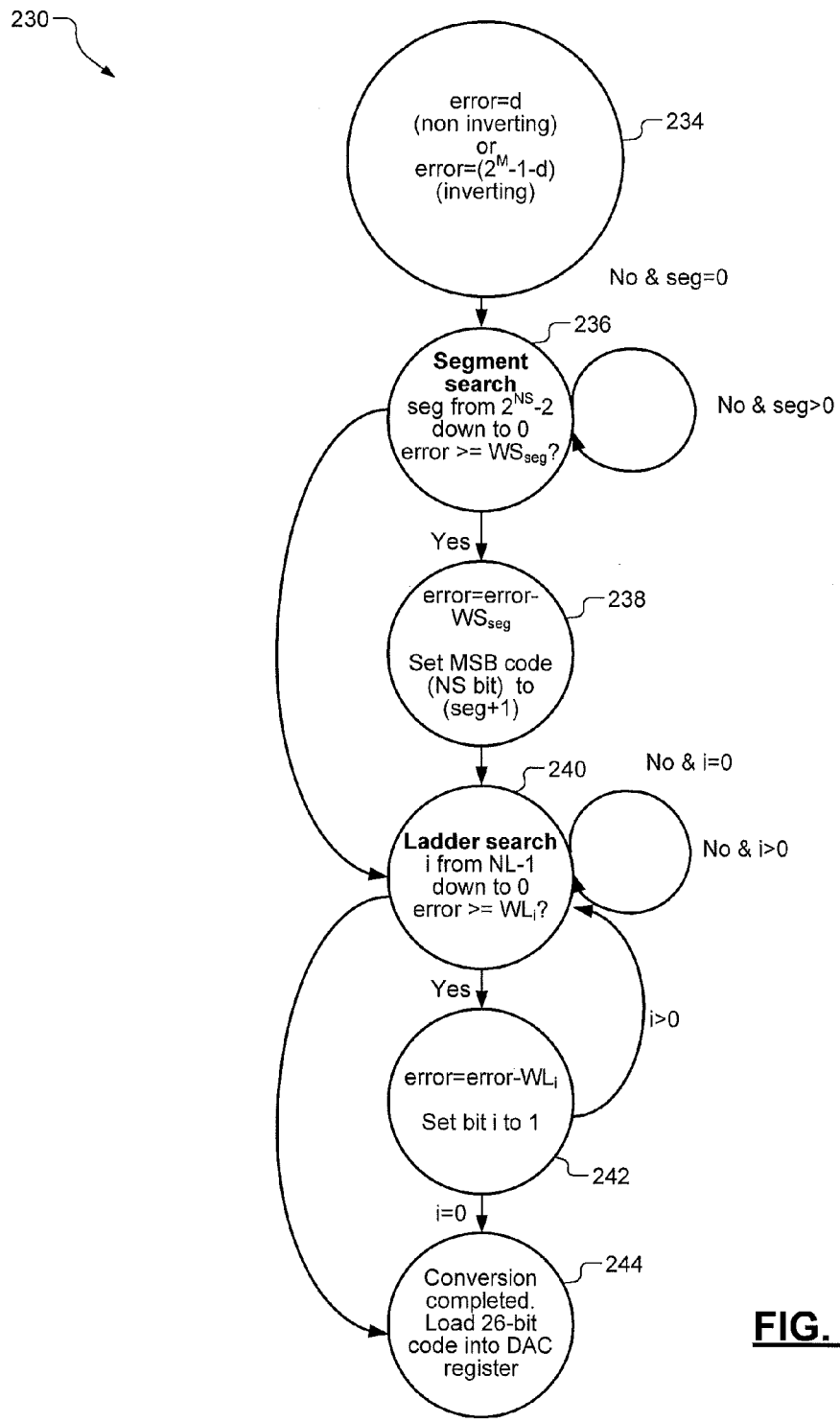
FIG. 11 is a flow diagram illustrating steps of the radix conversion method according to the present disclosure.

Referring now to FIG. 11, the method 220 is shown as a radix conversion state diagram 230 that begins in step 234. In step 234, control calculates a scaled input DAC code. For example, an "error" value is initialized to input DAC code d for non-inverting situations, where d corresponds to an M bit input DAC code, or to ($2^M$−1−d) for inverting situations.

In step 236, control begins a segment search. For example, starting from the MSB segment (for seg from $2^{NS}$−2 to 0), control finds a first segment having an analog weight less than the scaled input code (error). If no segment meets this criterion, then no segments are turned on. Control determines whether error is greater than or equal to WSseg, where WS corresponds to the segment analog weight in LSB. If true, control continues to step 238. If false and seg is greater than 0, control repeats step 236 for the next WSseg. If false and seg=0, control continues to step 240 to begin a ladder search. In step 238, control sets a new value of the error to error −WSseg (for the first segment less than the error), and turns on segments 0 through seg of the MSB bits (i.e. sets MSB code (NS bit) to (seg +1)).

Control performs the ladder search for each bit, for i from NL−1 down to 0, in steps 240 and 242. In step 240, control determines whether the error is greater than or equal to WLi of a current bit, where WL corresponds to the ladder analog weight in LSB. If true, control continues to step 242. If false, control ignores bit i (i.e. sets bit i to 0). If false and i is greater than 0, control repeats step 240. If false and i=0, control continues to step 244. In step 242, control sets a new value of error to error −WLi and keeps bit i (i.e. sets bit i to 1), and determines whether all bits (for i from NL−1 to 0) have been evaluated (i.e. i=0). If true, control continues to step 244. If false (i.e. i is greater than 0), control returns to step 240. In step 244, code conversion is completed and the converted code (e.g. a 22-bit code for NS=4 and NL=18) is stored. For example, control may load the code into a DAC register.

Figure 12:
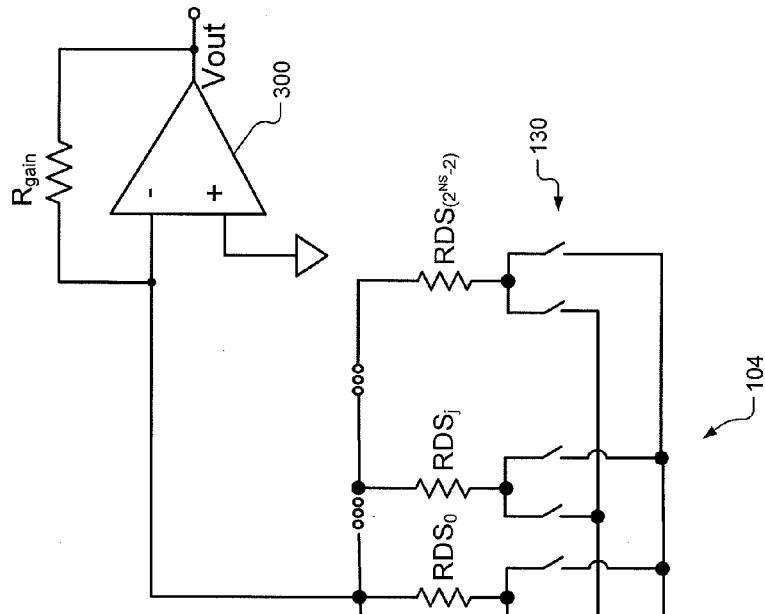
FIG. 12 is a code mapping table of a sub-binary radix DAC according to the present disclosure.

An example code mapping table 250 according to the present disclosure for input DAC codes from 000 to 111 is shown in FIG. 12. The example code mapping table 250 corresponds to the following design parameters: effective number of bits (i.e. bits of input DAC code)=3; radix DAC number of bits=4; and radix=1.5.

Figure 13:
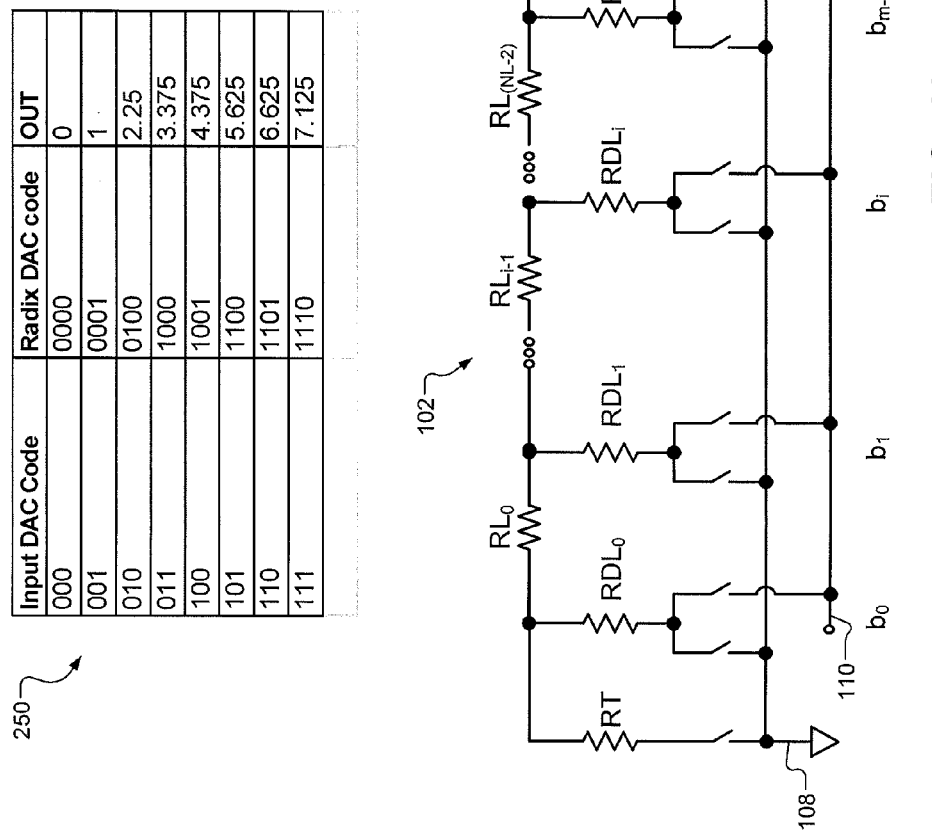
FIG. 13 is a schematic of a sub-binary radix DAC incorporating gain trim according to the present disclosure.

Referring now to FIG. 13, the implementation of the principles of the present disclosure allows a desired gain trim to be achieved without an additional analog or digital trim network. For example only, the DAC 100 may include an inverting output amplifier 300 and a resistor Rgain connected to the resistor RDS0 of the MSB segment module 104. When a value of Rgain is larger than a nominal DAC output resistance RDAC, a positive initial gain error is introduced to the DAC 100. When the calibration is performed including the Rgain, (e.g., analog weights are measured at the amplifier output VOUT), the gain error will automatically be removed in the proposed radix conversion algorithm.

Figure 14A:
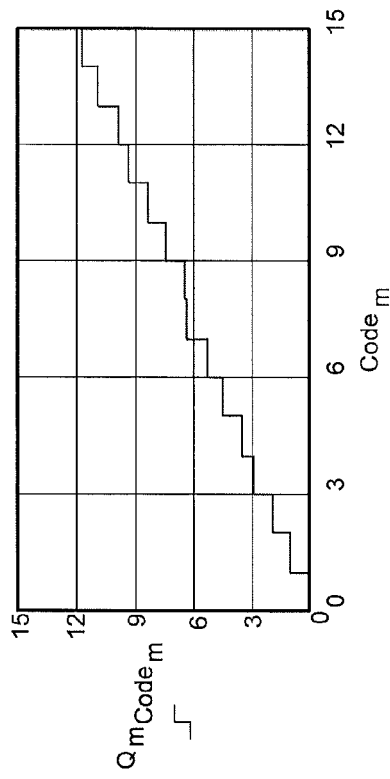
FIG. 14A illustrates DAC output after calibration according to the prior art.
Figure 14B:
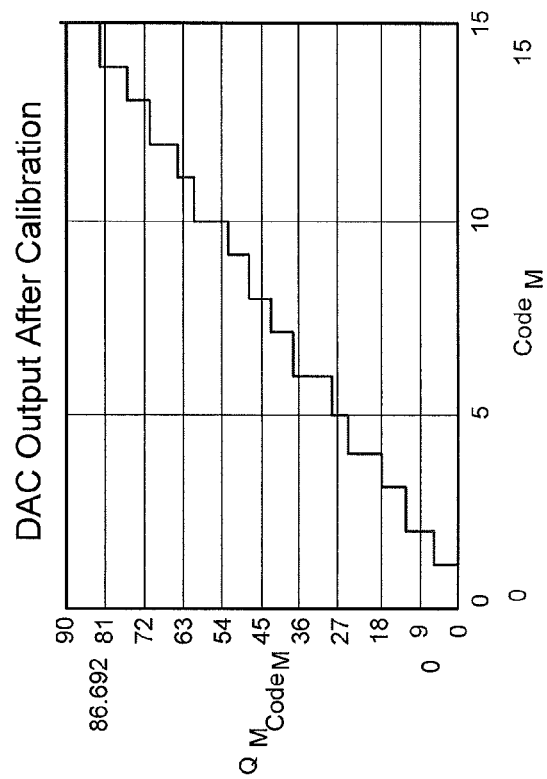
FIG. 14B illustrates DAC output after calibration according to the present disclosure.
Figure 16A:
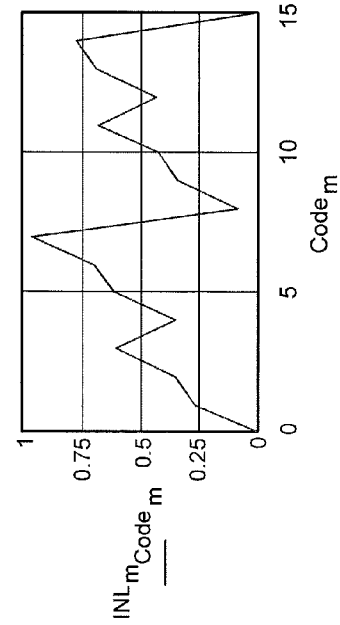
FIG. 16A illustrates INL after calibration according to the prior art.
Figure 16B:
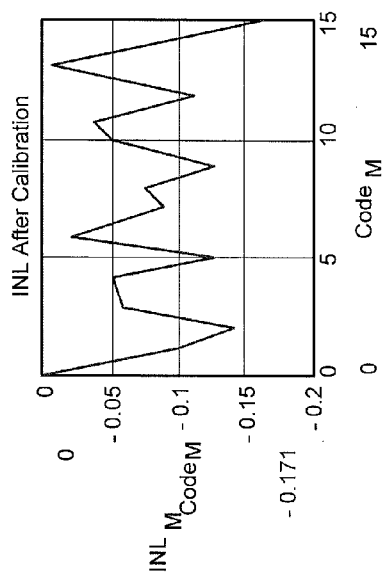
FIG. 16B illustrates INL after calibration according to the present disclosure.
Figure 15A:
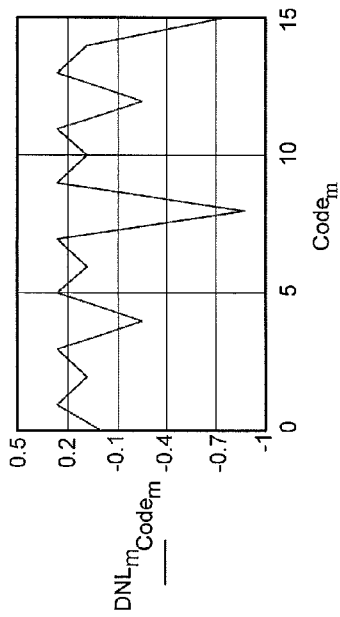
FIG. 15A illustrates DNL after calibration according to the prior art.
Figure 15B:
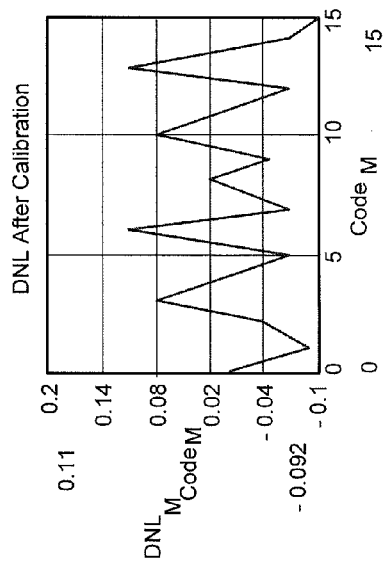
FIG. 15B illustrates DNL after calibration according to the present disclosure.

Referring now to FIGS. 14A and 14B, DAC output after calibration is shown for a conventional DAC and the DAC 100 according to the present disclosure, respectively. Referring now to FIGS. 15A and 15B, DNL after calibration is shown for a conventional DAC and the DAC 100 according to the present disclosure, respectively. Referring now to FIGS. 16A and 16B, INL after calibration is shown for a conventional DAC and the DAC 100 according to the present disclosure, respectively. For each of FIGS. 14A, 14B, 15A, 15B, 16A, and 16B, the following design parameters are assumed: effective number of bits=4; radix DAC number of bits=7; and radix=1.857.

Further, although the sub-binary radix DAC 100 as shown in FIG. 5 is described in FIGS. 5-16 as including the LSB ladder module 102, the DAC 100 may include other suitable structure (e.g., instead of and/or in addition to the LSB ladder module 102) for implementing the principles of the present disclosure. For example, the DAC 100 may implement structure including, but not limited to, various current source and/or voltage source non-segmented and segmented arrangements.

Figure 17:
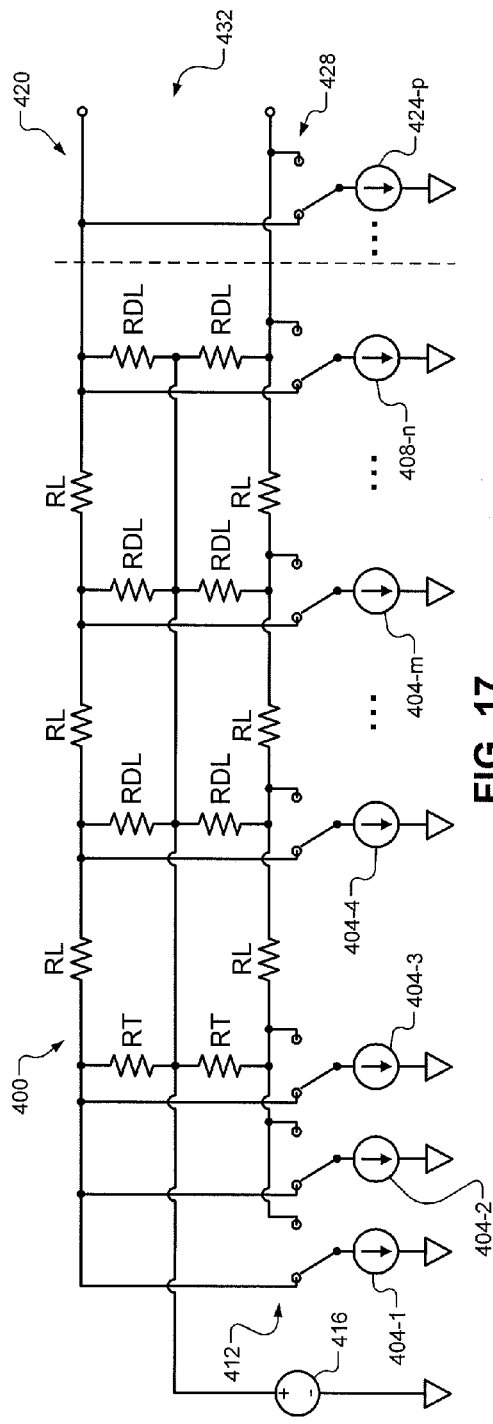
FIG. 17 is a schematic of a combination of an example current source ladder module and an MSB segment module of a sub-binary radix DAC according to the present disclosure.

Referring now to FIG. 17, another example ladder module 400 is shown to include resistors RL, resistors RDL, and termination resistors RT. Each of the resistors RL has a value R and each of the resistors RDL has a value βR. The termination resistors RT each have a value of $[(\gamma*\beta)/(\gamma+\beta)]R$. The values of β and γ satisfy the equation $\gamma 2=\beta+\gamma$. The ladder module 400 further includes current sources 404-1, 404-2, 404-3, 404-4, ..., and 404-m, referred to collectively as current sources 404, one or more current sources 408-n, referred to collectively as current sources 408, respective switches 412, and a common mode voltage source 416. An example segment module 420 is shown to include one or more current sources 424-p, referred to collectively as current sources 424, and respective switches 428. Each of the current sources 404, 408, and 424 and the common mode voltage source 416 is connected to an analog reference signal such as ground. Although the ladder module 400 and the segment module 420 are shown including a differential voltage output 432, those skilled in the art can appreciate that the ladder module 400 and the segment module 420 may be arranged to provide a single-ended voltage output.

Accordingly, the ladder module 400 and the segment module 420 provide similar functions as described in FIGS. 5-16 using the current sources 404, 408, and 424. For example only, the current sources 404, 408, and 424 include MOS and/or bipolar current sources. For example, the current sources 404-3, 404-4, 404-m, 408-n, and 424-p may have a value of I, the current source 404-2 may have a value of I/2, and the current source 404-1 may have a value of I/4. In some implementations, the current sources 404, 408, and 424 may be scaled (i.e., weighted) according to a desired sub-radix calibration. For example, the current sources 404 may have values that correspond to a mixed radix to achieve a desired linearity calibration of the DAC, and the current sources 408-n correspond to any desired multiple of non-segmented current sources. Conversely, the current sources 424-p corresponds to any desired number of, for example only, sub-binary radix current sources.

Figure 18:
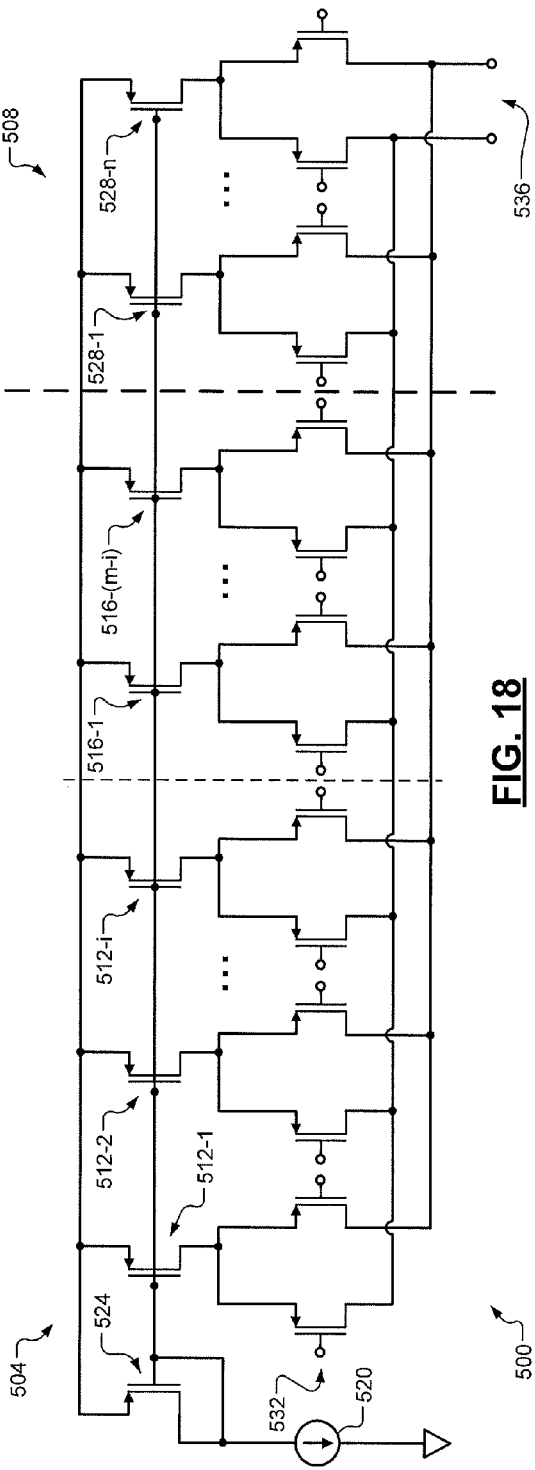
FIG. 18 is a schematic of a combination of another example current source ladder module and an MSB segment module of a sub-binary radix DAC according to the present disclosure.

Referring now to FIG. 18, an example current mode DAC 500 includes an LSB module 504 and an MSB segment module 508. The LSB module 504 includes LSB transistors 512-1, 512-2, ..., and 512-i, referred to collectively as LSB transistors 512, each corresponding to a respective one of i LSBs having a radix of r1, and MSB transistors 516-1 ... 516-(m-i), referred to collectively as MSB transistors 516, each corresponding to a respective one of m-i MSBs having a radix of r2. A current source 520 provides a current (e.g., 1LSB) to the transistors 512 and 516 via a transistor 524. The MSB segment module 508 includes segment transistors 528-1, ..., and 528-n, referred to collectively as segment transistors 528, each corresponding to one of n segments having a radix of r2.

Respective sizes of the transistors 512, 516, and 528 may be scaled according to a desired sub-radix calibration. For example, the transistors 524 and 512-1 may have a unit size of 1 x. The transistor 512-2 may have a size of r1*x. The transistor 512-i may have a size of r1^(i−1)*x. The transistor 516-1 may have a size of r2^(m−1)*x. The transistors 528-1 and 528-(m-i) may each have a size of r2^m*x.

Each of the transistors 512, 516, and 528 communicates with a corresponding one of pairs of switches (i.e., transistors) 532. For example only, each of the pairs of switches 532 operates as described above (e.g., with respect to the switches 130 shown in FIG. 6) to set or clear selected bits of the LSB module 504 and the MSB segment module 508. For example, a bit may be set when one of the switches 532 in a given pair is closed, and the bit may be cleared when the other of the switches 532 in the given pair is closed. For example only, respective gates of the pair of switches 532 corresponding to the transistor 512-1 may receive a signal corresponding to a data bit 1 and a signal corresponding to an inverse of the data bit 1. Similarly, respective gates of the pair of switches 532 corresponding to the transistor 512-i may receive a signal corresponding to a data bit i and a signal corresponding to an inverse of the data bit i. For example only, a switch control module such as the switch control module 106 shown in FIG. 5 generates the signals to control the switches 532 to set and clear respect bits of the DAC 500. The DAC 500 generates an output 536 according to the current source 520 and the operation of the transistors 512, 516, and 528 and the switches 532.

Those skilled in the art can appreciate that the current source/mode DACs described in FIGS. 17 and 18 are only two example alternative arrangements of a ladder (or LSB module) and/or a segment module. For example only, various current source/mode structures, voltage source/mode structures, and other suitable structures including a plurality of circuit elements corresponding to DAC bits and segments may be provided to implement a segment module according to the principles of the present disclosure. The plurality of circuit elements may include, but are not limited to, NL resistors, transistors, and/or current sources corresponding to ladder bits of the DAC, and NS resistors, transistors, and/or current sources corresponding to segment bits of the DAC, connected in parallel as shown in FIGS. 6, 17, and 18.

In another implementation, the calibration step measures and converts the ladder bit and segment bit analog weights to LSB. The results of the method are used to generate a calibration table that associates each bit i from 0 to m−1 with a corresponding analog weight $WL_i$. In other words, the calibration table according to this implementation uses analog weights WL (instead of digital weights).

Figures 19, 20, 21:
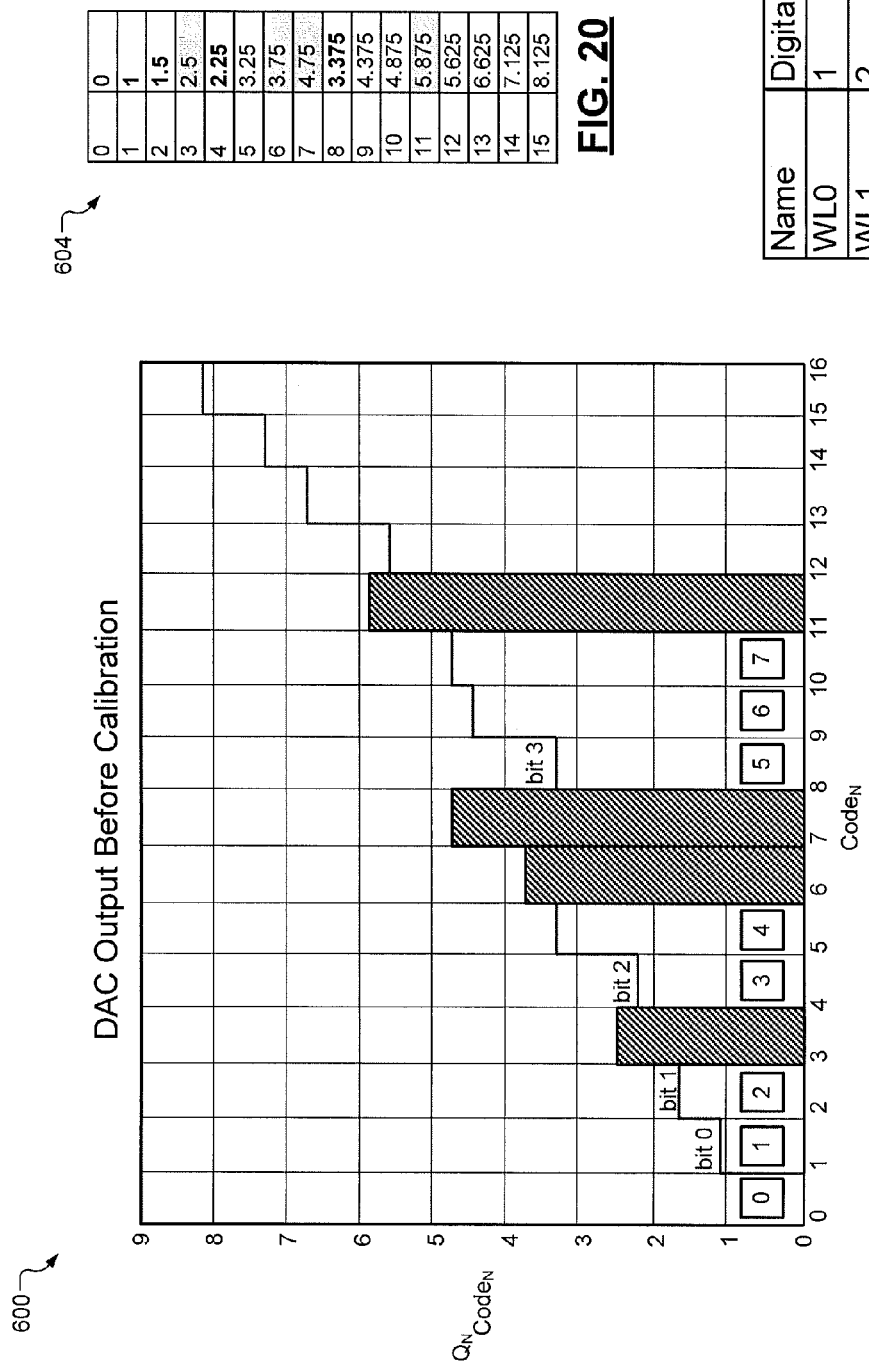
FIG. 19 illustrates example DAC output before calibration.
FIG. 20 illustrates code values for the DAC output of FIG. 19.
FIG. 21 illustrates an example calibration table for the DAC output and code values of FIGS. 19 and 20 using digital weights according to the prior art.

For example, FIGS. 19, 20, and 21 illustrate an example DAC output 600, code values 604, and an example calibration table 608 using digital weights before calibration. Accordingly, the digital weights 1, 2, 3, and 5 are used for $WL_0$, $WL_1$, $WL_2$, and $WL_3$, m=4, an effective number of bits M=3, a number of extra bits $N_{extra}$=1, a radix number of bits=4 (M+$N_{extra}$), and the radix is 1.5. The example code mapping table 250 for input DAC codes from 000 to 111 and a code ratio of 1.5 is shown in FIG. 12. The DAC output after calibration, using the digital weights, is shown in FIG. 14B. The DNL after calibration, using the digital weights, is shown in FIG. 15B. The INL after calibration, using the digital weights, is shown in FIG. 16B.

Figures 22, 23, 24:
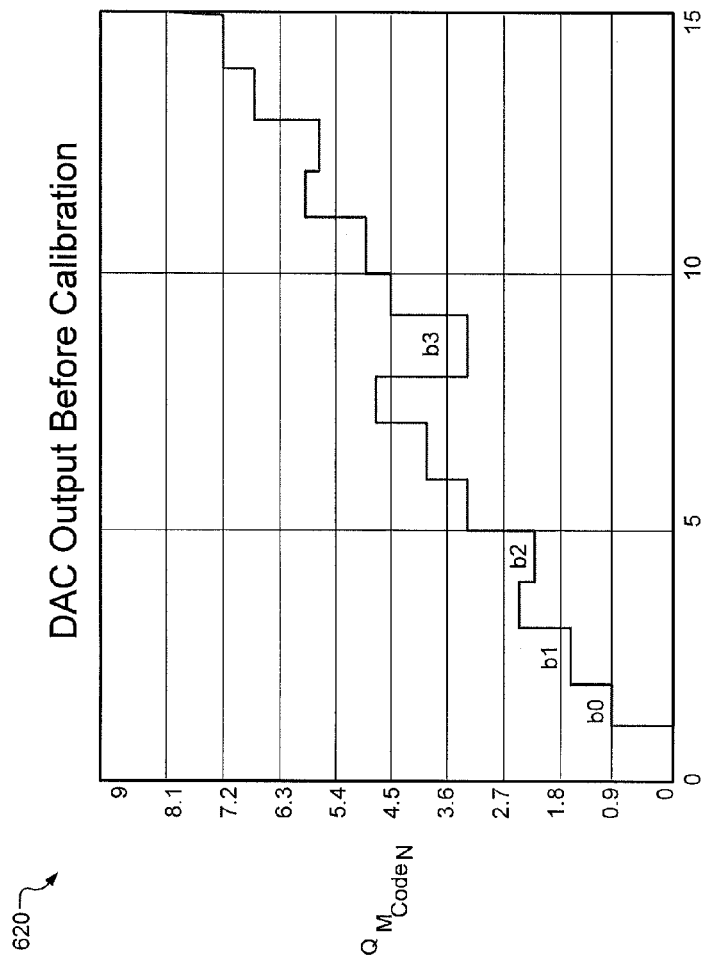
FIG. 22 illustrates an example DAC output before calibration.
FIG. 23 illustrates code values for the DAC output of FIG. 22.
FIG. 24 illustrates an example calibration table for the DAC output and code values of FIGS. 22 and 23 using analog weights according to the present disclosure.

Conversely, FIGS. 22, 23, and 24 illustrate an example DAC output 620, code values 624, and an example calibration table 628 using an analog weight trim method before calibration. Example analog weights 0.8615, 1.2923, 1.9385, and 2.9077 are used for $WL_0$, $WL_1$, $WL_2$, and $WL_3$, m=4, an effective number of bits M=3, a number of extra bits $N_{extra}$=1, a radix number of bits=4 (M+$N_{extra}$), and the radix is 1.5.

As shown in the code values 624, the analog outputs for bits b0, b1, b2, and b3 correspond to 1, 1.5, 2.25, and 3.375, and the LSB corresponds to 8.125. Further, the full scale code of the DAC corresponds to $2^M-1$, or, for M=3, $2^3-1=7$. As such, the LSB=8.125/7=1.1607. The example analog weights 0.8615, 1.2923, 1.9385, and 2.9077 are derived from respective values 1, 1.5, 2.25, and 3.375 divided by 1.1607.

Figures 25, 26:
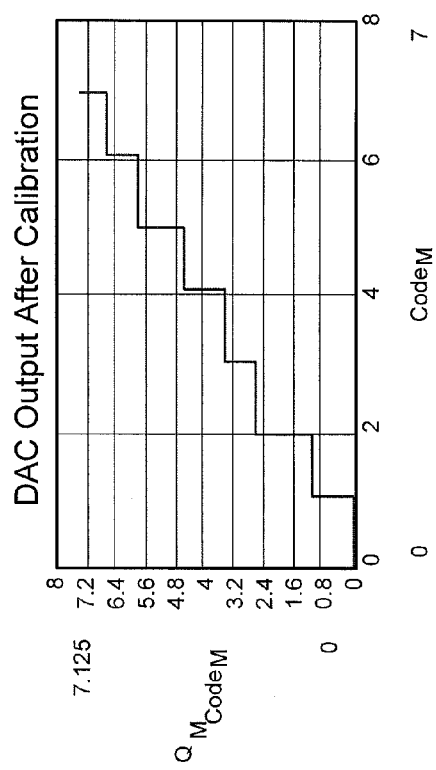
FIG. 25 is a code mapping table of a sub-binary radix DAC for analog weights according to the present disclosure.
FIG. 26 illustrates DAC output after calibration using analog weights according to the present disclosure.
Figure 27:
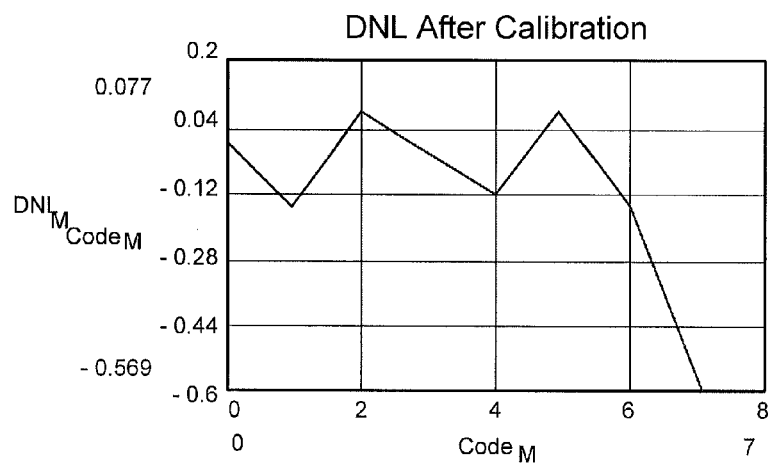
FIG. 27 illustrates DNL after calibration using analog weights according to the present disclosure.
Figure 28:
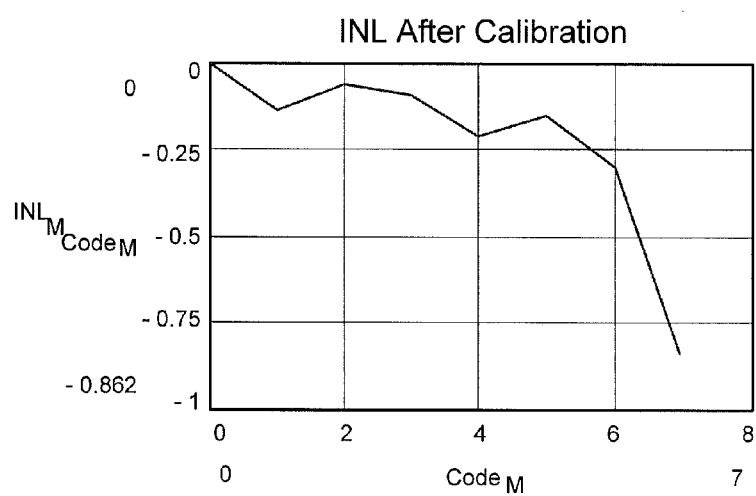
FIG. 28 illustrates INL after calibration using the analog weights according to the present disclosure.

In other words, the analog weights correspond to non-integer values. Results of calibration using the analog weights are shown in FIGS. 25, 26, 27, and 28. An example code mapping table 632 for input DAC codes from 000 to 111 and a code ratio of 1.5 is shown in FIG. 25. The DAC output after calibration, using the analog weights, is shown in FIG. 26. The DNL after calibration, using the analog weights, is shown in FIG. 27. The INL after calibration, using the analog weights, is shown in FIG. 28.

The radix conversion step is performed using an example successive subtraction method using analog weights instead of digital weights. The method performs successive subtraction of the analog weight $WL_i$ from the binary input value of the digital input signal 114 to determine which bits of the DAC (e.g., the DAC 100) are set and which bits of the DAC are cleared. Results of the method are used to generate a radix DAC code, and subsequently an output value, for each input DAC code. For example only, the code mapping table 632 as shown in FIG. 25 illustrates a relationship between input DAC codes from 000 to 111 and corresponding radix DAC codes and output values.

Figure 29:
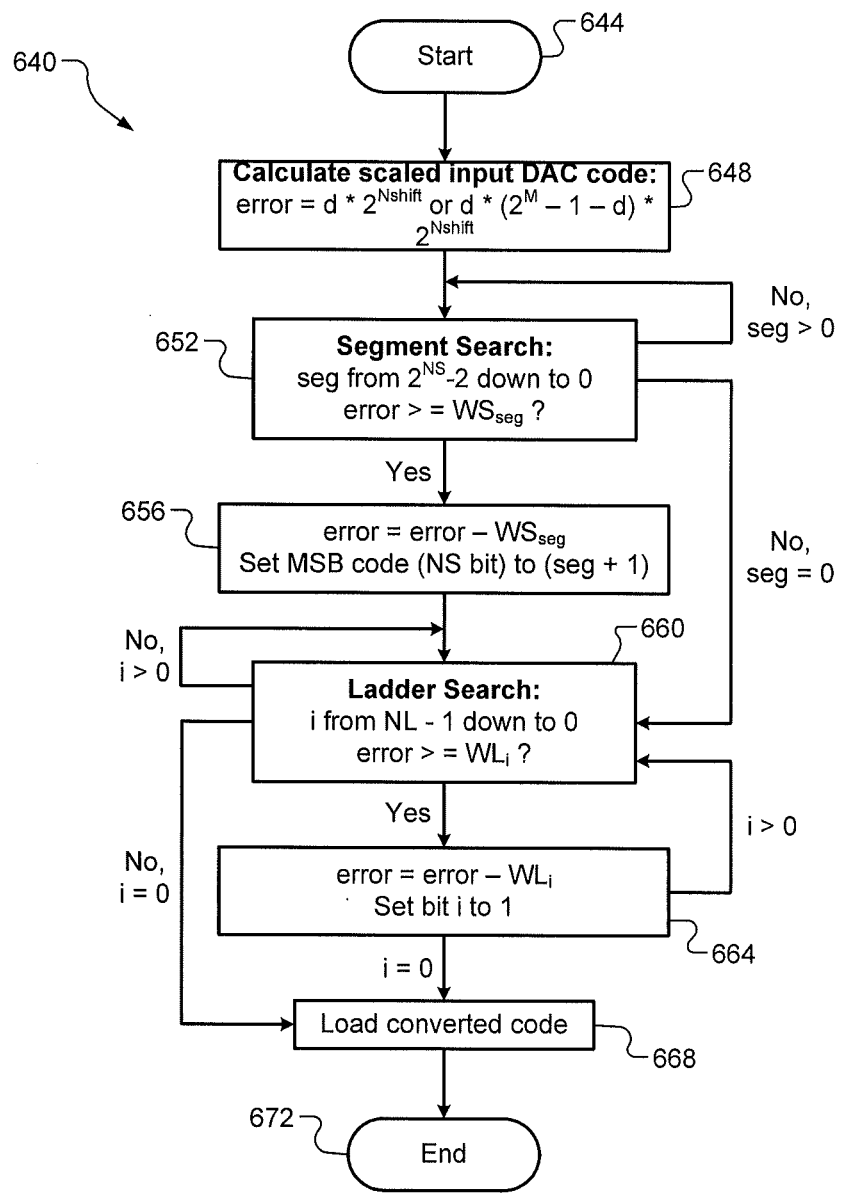
FIG. 29 is a flow diagram illustrating steps of the radix conversion method using analog weights according to the present disclosure.

An example radix conversion method 640 using analog weights is shown in FIG. 29. The radix conversion method 640 determines which bits of the DAC 100 are kept (i.e. set to 1) and which bits are cleared or ignored (i.e. set to 0) using a successive approximation method as shown.

The method 640 begins at 644. In step 648, the method 640 calculates a scaled input DAC code. For example, an "error" value is initialized to $d*2^{Nshift}$ for non-inverting situations or $(2^M-1-d)*2^{Nshift}$ for inverting situations, where d is the m bit pre-scaled input DAC code and Nshift corresponds to a number of bits that trim coefficients were shifted during trimming. For example, during trimming, the trim coefficients may be shifted to compensate for the fact that the analog weights are non-integers. For example only, Nshift=6. Accordingly, in contrast to the radix conversion method 230 using digital weights as shown in FIG. 11, the error is initialized to $d*2^{Nshift}$ or $(2^M-1-d)*2^{Nshift}$ instead of d*ratio, where "ratio" corresponds to the ratio of code_total to the m bit full code.

At 652, the method 640 performs a segment search. For example, starting from the MSB segment (for seg from $2^{Ns}-2$ to 0), the method 640 finds a first segment having an analog weight less than the scaled input code (error). For example, the segment bit NS=6. If no segment meets this criterion, then no segments are turned on. The method 640 determines whether error is greater than or equal to WSseg, where WS corresponds to a segment analog weight. If true, the method 640 continues to 656. If false and seg is greater than 0, the method 640 repeats step 652 for the next WSseg. If false and seg=0, the method 640 continues to 660 to begin a ladder search. In step 656, the method 640 sets a new value of the error to error −WSseg (for the first segment less than the error), and turns on segments 0 through seg of the MSB bits (i.e. sets MSB code (NS bit) to (seg +1)).

The method 640 performs the ladder search for each bit, for i from NL−1 down to 0, at 660 and 664. For example, the ladder bit NL=20. At 660, the method 640 determines whether error is greater than or equal to WLi of a current bit I, where WL corresponds to a ladder analog weight. If true, the method 640 continues 664. If false, the method 640 ignores bit i (i.e. sets bit i to 0). If false and i is greater than 0, the method repeats step 660. If false and i=0, the method 640 continues to 668. At 664, the method 640 sets a new value of error to error −WLi and keeps bit i (i.e. sets bit i to 1), and determines whether all bits (for i from NL−1 to 0) have been evaluated (i.e. i=0). If true, the method 640 continues to step 668. If false (i.e. i is greater than 0), the method 640 returns to 660. In step 668, code conversion is completed and the converted code (e.g. a 26-bit code for NS=6 and NL=20) is stored. For example, the method 640 may load the code into a DAC register. The method 640 ends radix conversion at 672.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A system comprising:
   a sub-binary radix digital-to-analog converter (DAC) that converts a digital input signal to an analog output signal based on a sub-radix DAC code; and
   a radix conversion module that performs radix conversion on the digital input signal,
   wherein, to perform the radix conversion, the radix conversion module (i) associates bit positions corresponding to the digital input signal with respective analog weights and (ii) converts the digital input signal to the sub-radix DAC code based on the respective analog weights.

2. The system of claim 1, wherein (i) the sub-binary radix DAC corresponds to an N bit sub-binary radix DAC, the digital input signal corresponds to an m bit digital input signal, m and N are integers greater than or equal to 1, and N>m.

3. The system of claim 1, wherein the analog weights correspond to non-integer values.

4. The system of claim 1, wherein associating the bit positions with the respective analog weights includes storing the respective analog weights in a calibration table that associates each of the bit positions with the respective analog weights.

5. The system of claim 1, wherein, to convert the digital input signal to the sub-radix DAC code, the radix conversion module performs successive subtraction on the digital input signal based on the respective analog weights.

6. The system of claim 5, wherein, to perform the successive subtraction, the radix conversion module successively subtracts each of the respective analog weights from a binary input value associated with the digital input signal.

7. The system of claim 5, wherein the radix conversion module performs the successive subtraction to determine which bits of the sub-binary radix DAC are set or cleared.

8. The system of claim 1, wherein the digital input signal includes m bits, wherein the radix conversion module converts the digital input signal to the sub-radix DAC code further based on a code ratio, and wherein the code ratio corresponds to a total number of available monotonic codes to $2^m$.

9. The system of claim 8, wherein, to convert the digital input signal to the sub-radix DAC code, the radix conversion module multiplies the digital input signal by the code ratio.

10. A method of operating a sub-binary radix digital-to-analog converter (DAC), the method comprising:
converting a digital input signal to an analog output signal based on a sub-radix DAC code; and
performing radix conversion on the digital input signal, wherein performing the radix conversion includes (i) associating bit positions corresponding to the digital input signal with respective analog weights and (ii) converting the digital input signal to the sub-radix DAC code based on the respective analog weights.

11. The method of claim 10, wherein the sub-binary radix DAC corresponds to an N bit sub-binary radix DAC, the digital input signal corresponds to an m bit digital input signal, m and N are integers greater than or equal to 1, and N>m.

12. The method of claim 10, wherein the analog weights correspond to non-integer values.

13. The method of claim 10, wherein associating the bit positions with the respective analog weights includes storing the respective analog weights in a calibration table that associates each of the bit positions with the respective analog weights.

14. The method of claim 10, wherein converting the digital input signal to the sub-radix DAC code includes performing successive subtraction on the digital input signal based on the respective analog weights.

15. The method of claim 14, wherein performing the successive subtraction includes successively subtracting each of the respective analog weights from a binary input value associated with the digital input signal.

16. The method of claim 14, wherein the successive subtraction is performed to determine which bits of the sub-binary radix DAC are set or cleared.

17. The method of claim 10, wherein the digital input signal includes m bits, wherein converting the digital input signal includes converting the digital input signal to the sub-radix DAC code further based on a code ratio, and wherein the code ratio corresponds to a total number of available monotonic codes to $2^m$.

18. The method of claim 17, wherein converting the digital input signal to the sub-radix DAC code includes multiplying the digital input signal by the code ratio.

* * * * *

UNITED STATES PATENT AND TRADEMARK OFFICE
CERTIFICATE OF CORRECTION

PATENT NO. : 9,337,860 B1
APPLICATION NO. : 14/721481
DATED : May 10, 2016
INVENTOR(S) : Yuanfang Li et al.

Page 1 of 1

It is certified that error appears in the above-identified patent and that said Letters Patent is hereby corrected as shown below:

In the Specification:

| | |
|---|---|
| Column 1, Line 58 | Delete "R-6R" and insert --R-$\beta$R-- |
| Column 4, Line 64 | Delete "RL0 . . . RLNL-1." and insert --RL$_0$ . . . RL$_{NL-1}$.-- |
| Column 4, Line 65 | Delete "RLi," and insert --RL$_i$,-- |
| Column 4, Line 65 | Delete "RDL0 . . . RDLNL-1," and insert --RDL$_0$ . . . RDL$_{NL-1}$,-- |
| Column 4, Line 66 | Delete "RDLi," and insert --RDL$_i$,-- |
| Column 4, Line 67 | Delete "RLi" and insert --RL$_i$-- |
| Column 5, Line 1 | Delete "RDLi" and insert --RDL$_i$-- |
| Column 5, Line 4 | Delete "RDS0" and insert --RDS$_0$-- |
| Column 5, Line 4 | Delete "($2^{Ns}$-2)," and insert --($2^{NS}$-2),-- |
| Column 5, Line 5 | Delete "RDSj." and insert --RDS$_j$.-- |
| Column 5, Line 5 | Delete "RDSj" and insert --RDS$_j$-- |
| Column 5, Line 7 | Delete "RDLi, and RDSj" and insert --RDL$_i$, and RDS$_j$-- |
| Column 5, Line 58 | Delete "$2^{Ns}$-2)." and insert --$2^{NS}$-2).-- |
| Column 6, Line 42 | Delete "Rgain" and insert --R$_{gain}$-- |
| Column 6, Line 43 | Delete "RDS0" and insert --RDS$_0$-- |
| Column 6, Line 44 | Delete "Rgain" and insert --R$_{gain}$-- |
| Column 6, Line 46 | Delete "Rgain," and insert --R$_{gain}$,-- |
| Column 7, Line 59 | Delete "1 x." and insert --1x.-- |
| Column 9, Line 39 | Delete "$2^{Ns}$-2" and insert --$2^{NS}$-2-- |

Signed and Sealed this
Twenty-sixth Day of July, 2016

Michelle K. Lee
*Director of the United States Patent and Trademark Office*